United States Patent (10) Patent No.: US 9,641,225 B2
Gong et al. (45) Date of Patent: May 2, 2017

(54) TRANSMITTING SYSTEM AND RECEIVING SYSTEM FOR MULTI-CARRIER BROADBAND SIMULTANEOUS INFORMATION AND ENERGY TRANSFER

(71) Applicant: South University of Science and Technology of China, Shenzhen (CN)

(72) Inventors: Yi Gong, Shenzhen (CN); Zidong Han, Shenzhen (CN)

(73) Assignee: South University of Science and Technology of China, Shenzhen (CN)

( * ) Notice: Subject to any disclaimer, the term of this patent is extended or adjusted under 35 U.S.C. 154(b) by 0 days.

(21) Appl. No.: 15/169,314

(22) Filed: May 31, 2016

(65) Prior Publication Data

US 2016/0285519 A1    Sep. 29, 2016

Related U.S. Application Data

(63) Continuation of application No. PCT/CN2015/075351, filed on Mar. 30, 2015.

(30) Foreign Application Priority Data

Mar. 25, 2015 (CN) .......................... 2015 1 0133784

(51) Int. Cl.
| | |
|---|---|
| *H04B 5/00* | (2006.01) |
| *H04L 5/00* | (2006.01) |
| *H03M 9/00* | (2006.01) |
| *H02J 50/80* | (2016.01) |

(52) U.S. Cl.
CPC ............ *H04B 5/0037* (2013.01); *H02J 50/80* (2016.02); *H03M 9/00* (2013.01); *H04B 5/0031* (2013.01); *H04L 5/0044* (2013.01)

(58) Field of Classification Search
CPC ..... H04B 5/0031; H04B 5/0037; H02J 50/80; H02J 50/10
See application file for complete search history.

(56) References Cited

U.S. PATENT DOCUMENTS

| 2012/0001593 | A1 | 1/2012 | Di Guardo | |
|---|---|---|---|---|
| 2014/0239732 | A1* | 8/2014 | Mach | H02J 5/00 307/104 |
| 2016/0118805 | A1* | 4/2016 | Swope | H02J 50/12 307/104 |

FOREIGN PATENT DOCUMENTS

| CN | 101064710 A | 10/2007 |
|---|---|---|
| CN | 104135454 A | 11/2014 |
| CN | 104320219 A | 1/2015 |

OTHER PUBLICATIONS

International Search Report issued for corresponding International Patent Application No. PCT/CN2015/075351 mailed on Dec. 23, 2015.

* cited by examiner

*Primary Examiner* — Ping Hsieh

(74) *Attorney, Agent, or Firm* — Myers Wolin, LLC

(57) ABSTRACT

A transmitting system and a receiving system for multi-carrier broadband simultaneous information and energy transfer are provided, the transmitting system comprising: a signal management control system, a baseband signal generating unit, an encoding unit, a serial-parallel conversion unit, a mapping unit, a modulation unit and a parallel-serial conversion unit. By adopting the transmitting system for simultaneous information and energy transfer, separate energy signals are transmitted simultaneously while the information signals are transmitted to the receiving end, and sufficient energy can be provided for the receiver. Besides, by optimizing information signal and energy signal through the optimization algorithm, not only the energy transfer efficiency but also the information transfer rate can be improved.

8 Claims, 3 Drawing Sheets

TRANSMITTING SYSTEM AND RECEIVING SYSTEM FOR MULTI-CARRIER BROADBAND SIMULTANEOUS INFORMATION AND ENERGY TRANSFER

CROSS-REFERENCE TO RELATED APPLICATIONS

This application is a continuation of International Application PCT/CN2015/075351, filed on Mar. 30, 2015, which claims priority to Chinese Application No. 201510133784.X, filed Mar. 25, 2015, the contents of each of which are hereby incorporated by reference.

FIELD OF THE INVENTION

The present invention relates to a cross field of wireless communication technology and wireless energy transfer technology, in particular to a transmitting system and receiving system for multi-carrier broadband simultaneous information and energy transfer.

BACKGROUND

Simultaneous Wireless Information and Energy Transfer (SWIET), that is, the simultaneous information and energy transfer which is performed in a wireless manner, is an emerging communication technology integrating the wireless communication technology and the wireless energy transfer technology. As technology advances, integration of energy technology and communication technology becomes a trend, which can not only realize a high-speed and reliable communication, but also effectively ease the pressure on scarcity of energy and spectrum, thereby being very promising in industry, medical service, infrastructure development, etc. SWIET is apparently advantageous over conventional wireless communication means, which takes energy aspect into consideration at the same time and integrates the wireless communication technology with the wireless energy transfer technology, thus enabling a parallel and simultaneous transfer of information and energy and having wide application value and innovation significance. Based on characteristic of simultaneous information and energy transfer, the SWIET may be used in various wireless terminals or devices which rely on cells or batteries of limited capacity for power supply, and feed the wireless terminals or devices with power by acquiring energy from signals, thereby greatly prolonging the time of use, reducing the device volume and cost and reducing production for cells or batteries. Thus, environmental pollution caused during production, manufacture and recovery of batteries is greatly reduced. For the characteristic of contactless transfer, the SWIET may have a possibility to replace conventional power transfer means such as cells or batteries or cables to supply power, so as to greatly facilitate the power supply. Further, the SWIET is significantly advantageous in stability and sustainability over conventional energy harvesters such as wind energy, solar energy, wave energy, etc. which mainly acquire energy from outside environment depending on unstable weather or geographic conditions. Further, the SWIET may find its wide applications in improving people's daily life and social welfare. For example, in medical field, after implantation of medical devices such as a cardiac pacemaker, a cardiovascular robot, etc, the user may often face a serious problem that is the shortage of power in cell, and however, the application of the SWIET technology may solve such a serious problem and avoid unnecessary operations which may cause secondary pain for the user. Technically, Zheng Zuxiang, Wu Lenan, et al. from Southeast University propose an AMPSK (Asymmetric M-ary Phase Shift Keying) ultra-narrow band modulation technology in Application No. 201410396157.0 (China Patent), titled as FREQUENCY DOMAIN POWER DISTRIBUTER FOR AMPSK WIRELESS INFORMATION AND ENERGY COMMUNICATION SYSTEM, and design a frequency domain power distributer based on this modulation technology. However, as this modulation technology is an ultra-narrow band technology, information rate is greatly compromised, and power loss occurs during power distribution, and secondly, power intensity of the signals may overly exceed civil safety standards.

SUMMARY

In order to solve the above technical problems, the system provides a transmitting system and a receiving system for multi-carrier broadband simultaneous information and energy transfer.

The technical solution that the present system adopts to solve its technical problems is as follows: a transmitting system for multi-carrier broadband simultaneous information and energy transfer, comprising:

a signal management control system, configured to match with an optimization algorithm, perform pre-allocation of carrier, power and frequency spectrum on information signal data stream and energy signal data stream in a baseband signal dynamically based on channel quality parameters, so as to generate a pre-allocation parameter set;

a baseband signal generating unit, configured to generate information baseband signal and energy baseband signal corresponding to the pre-allocation parameter set; an encoding unit, configured to encode the information baseband signal and the energy baseband signal respectively so as to generate corresponding encoded information baseband signal and encoded energy baseband signal;

a serial-parallel conversion unit, configured to perform serial-parallel conversion on the encoded information baseband signal and the encoded energy baseband signal to generate parallel data streams;

a mapping unit, configured to classify the parallel data streams and perform corresponding modulation and pre-allocation on the information baseband signal and energy baseband signal in the parallel data streams according to the pre-allocation parameter set;

a modulation unit, configured to modulate the information baseband signal and energy baseband signal in the parallel data streams onto pre-allocated subcarriers according to the result of the modulation and pre-allocation;

a parallel-serial conversion unit, configured to convert the parallel data streams into a serial data stream and transmit it to an antenna unit; and an antenna unit, configured to transmit the serial data stream output from the parallel-serial conversion unit.

Based on the above technical solution, the present system may also be modified as follows.

Further, the signal management control system may comprise:

a channel parameter acquiring unit, configured to acquire channel quality parameters;

an optimization algorithm processing unit, configured to optimize the energy baseband signal and the information baseband signal based on preset optimization objectives and constraints;

wherein said preset optimization objectives may involve number of energy signal carriers, power, and information transmission rate in information signal; and said constraints may involve:

the power acquired by the receiver being equal to or greater than the minimum power required for the operation mode of the receiver per unit time (symbol time);

the sum of powers of the energy signals on the subcarriers being less than or equal to the total power of the energy signals;

the average power spectral density on each of subcarrier frequency bands being less than or equal to a given parameter value;

the sum of powers of the information signals on the subcarriers being less than or equal to the total power of the information signals;

a pre-allocation parameter unit, configured to generate a pre-allocation parameter set according to an optimization result of the optimization algorithm processing unit.

The technical solution with the above improvements has the following advantageous effects:

Wireless information transfer is performed based on wireless energy transfer, which ensures that the power acquired by the receiver reaches the minimum power required by its corresponding operating mode and the normal operation of the receiver can be guaranteed, thus the stability and reliability of the system is greatly improved. As the power consumed by a receiver circuit for signal processing may be greater than the energy of the information signals themselves, the power of the energy signals in the system may be greater than or even much greater than the power of the information signals. Therefore, the above technical solution may substantially raise energy utilization and lower waste of energy, thus being more environmentally friendly. Meanwhile, through optimization, power is further reasonably allocated, the communication rate is further improved, and performance of the system is further improved.

Further, the pre-allocation parameter set may comprise an information baseband signal pre-allocation parameter set and an energy baseband signal pre-allocation parameter set;

said information baseband signal pre-allocation parameter set may comprise:

an information signal power allocation set; and
an information signal subcarrier allocation set;
said energy baseband signal pre-allocation parameter set may comprise:

an energy signal subcarrier allocation set;
an energy signal power allocation set; and
the total power of energy signals.

Further, the baseband signal generating unit may comprise an information baseband signal generating unit and an energy baseband signal generating unit;

the energy baseband signal generating unit may perform power distribution on energy baseband signal data streams according to the energy signal power allocation set and the total power of the energy signals in the energy baseband signal pre-allocation parameter set, and add subcarrier distribution information to frame headers of corresponding energy baseband signal data streams according to the energy signal subcarrier allocation set.

Further, the encoding unit may comprise an information baseband signal encoding unit and an energy baseband signal encoding unit;

said information baseband signal encoding unit may perform convolutional encoding on the information baseband signals; and said energy baseband signal encoding unit may perform quadrature encoding on the energy baseband signals.

With the above improvement, the technical solution may have the following advantageous effects:

Since useful data is contained in the information baseband signals, and the energy signals only need to be identified and transmitted, the information baseband signals may be encoded in a manner with higher reliability, while the energy baseband signals may be encoded in a relatively simple manner. As long as the demands of the user can be satisfied, encoding the information baseband signals and the energy baseband signals with different encoding manners may lower the complexity of encoding and optimize the system performance.

Further, the modulation unit may comprise an information baseband signal modulation unit and an energy baseband signal modulation unit; and the energy baseband signal modulation unit may performs spectrum spreading modulation on the energy baseband signals.

The technical solution with the above improvement may have the following advantageous effects:

The energy baseband signals may have a power spectral density that is much higher than that of the information signals, which may exceed the safety standard. The power spectral density may be reduced through spectrum spreading modulation of the energy baseband signals. In combination with the optimized bandwidth and power density amplitude allocated, the power spectral density of the energy baseband signals is made to satisfy the safety standard.

Further, the energy baseband signal modulation unit may comprise an impulse forming filtering module, a spreading module and a mixing module, three of which are connected sequentially.

Further, a guard interval inserting unit may be arranged between the modulation unit and the parallel-serial conversion unit.

The present system also discloses a receiving system for multi-carrier broadband simultaneous information and energy transfer, comprising:

an antenna unit, configured to receive serial signals transmitted from a transmitting end;

a synchronization unit, configured to synchronize the received serial signals with the transmitting end in frequency and phase;

a channel estimation unit, configured to generate channel quality parameters and feed the channel quality parameters back to the transmitting system for multi-carrier broadband simultaneous information and energy transfer;

a serial-parallel conversion unit, configured to convert the received serial signals into parallel signals;

a receiving end mapping unit, configured to separate the information signals from the energy signals in the parallel signals;

a demodulation unit, configured to demodulate the information signals and the energy signals respectively to obtain information baseband signals and energy baseband signals;

a parallel-serial conversion unit, configured to convert the parallel information baseband signals and energy baseband signals into a serial signals; a decoding unit, configured to decode the information baseband signals in the serial signals; and a rectification unit, configured to filter and rectify the energy baseband signals in the serial signals and convert them into DC signals to be stored in storage batteries.

Based on the above technical solution, the present system may also be modified as follows.

Further, the modulation unit may comprise an information signal modulation unit and an energy signal modulation unit; and the parallel-serial conversion unit may comprise an information signal parallel-serial conversion unit and an energy signal parallel-serial conversion unit.

The present system has the following advantageous effects:

By adopting said transmitting system for simultaneous information and energy transfer, independent energy signals are transmitted simultaneously while the information signals are transmitted to the receiving end, and sufficient energy can be provided for the receiver. Besides, by optimizing the information signals and the energy signals through the optimization algorithm, not only the energy transfer efficiency but also the information transfer rate can be improved. Moreover, said transmitting system for simultaneous information and energy transfer is particularly applicable to the following fields.

Existing or future medical devices to be implanted into human bodies, such as a cardiac pacemaker, an artificial hearts, a cardiovascular robot, phakic eyes, an electronic cochlea, an electrical tendo calcaneus, an electronic artificial limb, etc, may be applied with the system. With the present system, simultaneous information and energy transfer and reception may be carried out on these medical devices, thus not only can these medical devices be fed with power to ensure normal operation thereof, but also normal lives of people who need these medical devices can be guaranteed. Moreover, pathological and physical data may be fed back in real time through mobile networks, and accidents may be prevented through modeling and prediction, and meanwhile, this large amount of data may be shared among medical science experts for data analysis, which may greatly promote the development of medical science and technology.

Wireless devices, such as wireless sensor networks having low power consumption, may need no batteries for power supply, especially for wireless sensor nodes arranged in complex environment such as forests, deserts, oceans, nuclear power plants, petrochemical plants, etc., which feed power and feed data back in a wireless manner.

With the transmitting system for simultaneous information and energy transfer, an intelligent household environment may be built, and mobile terminals such as mobile phones may be fed with power anytime and anywhere, guaranteeing users' normal conversation. Feeding the sensors with power allows for knowing of parameters (for example, temperature, humidity, etc.) inside and outside the house. A central control system may be used to make intelligent adjustment and control of the household, which may save energy and be environmentally-friendly.

The transmitting system and receiving system for multi-carrier broadband simultaneous information and energy transfer of the present disclosure may reduce usage and production of cells or batteries in the wireless receiving devices significantly, thereby greatly reducing environmental pollution caused during production, manufacture and recovery of the cells or batteries, and therefore is a technology that is very beneficial for developing environment friendly green economy.

DETAILED DESCRIPTION OF THE PREFERRED EMBODIMENTS

Principles and characteristics of the present invention are described below in connection with accompanying drawings, and examples are merely provided to illustrate the present invention, rather than limiting the scope of the present invention.

Figure 1:
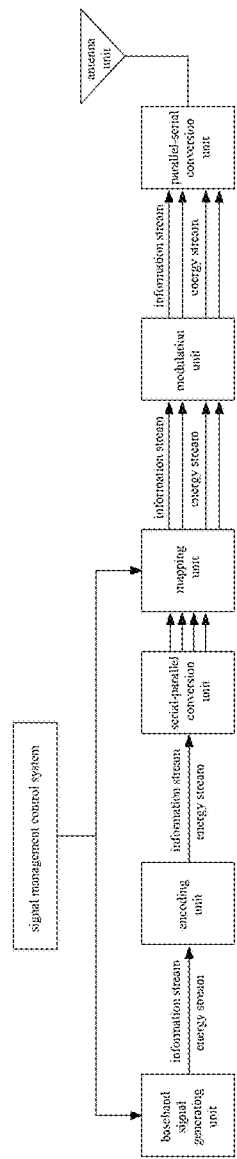
FIG. 1 is a structural schematic view of a transmitting system for multi-carrier broadband simultaneous information and energy transfer.

FIG. 1 is a structural schematic view of a transmitting system for multi-carrier broadband simultaneous information and energy transfer. As shown in FIG. 1, a transmitting system for multi-carrier broadband transmitting system is provided, which comprises:

a signal management control system, configured to match with an optimization algorithm, perform pre-allocation of carrier, power and frequency spectrum on information signal data stream and energy signal data stream in a baseband signal dynamically based on channel quality parameters, so as to generate a pre-allocation parameter set;

a baseband signal generating unit, configured to generate information baseband signal and energy baseband signal corresponding to the pre-allocation parameter set;

an encoding unit, configured to encode the information baseband signal and the energy baseband signal respectively so as to generate corresponding encoded information baseband signal and encoded energy baseband signal;

a serial-parallel conversion unit, configured to perform serial-parallel conversion on the encoded information baseband signal and the encoded energy baseband signal to generate parallel data streams;

a mapping unit, configured to classify the parallel data streams and perform corresponding modulation and pre-allocation on the information baseband signal and energy baseband signal in the parallel data streams according to the pre-allocation parameter set;

a modulation unit, configured to modulate the information baseband signal and energy baseband signal in the parallel data streams onto pre-allocated subcarriers according to the result of the modulation and pre-allocation;

a parallel-serial conversion unit, configured to convert the parallel data streams into a serial data stream and transmit it to an antenna unit; and an antenna unit, configured to transmit serial data stream output from the parallel-serial conversion unit.

Figure 2:
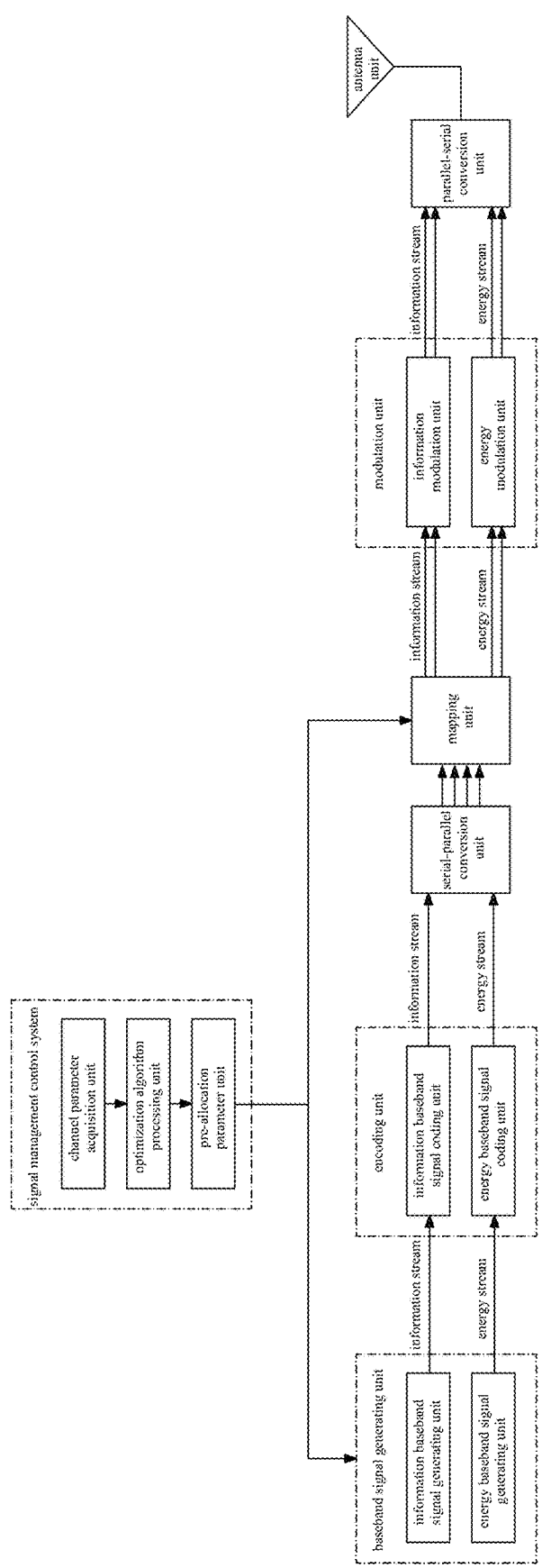
FIG. 2 is a structural schematic view of a specific embodiment of the transmitting system for multi-carrier broadband simultaneous information and energy transfer.

FIG. 2 is a structural schematic view of a specific embodiment of the transmitting system for multi-carrier broadband simultaneous information and energy transfer. As shown in FIG. 2, in this specific embodiment, the signal management control system comprises: a channel parameter acquiring unit, an optimization algorithm processing unit and a pre-allocation parameter unit.

The signal management control system, may match with an optimization algorithm, perform pre-allocation of carrier, power and frequency spectrum on information signal data stream and energy signal data stream in a baseband signal dynamically based on channel quality parameters, so as to generate a pre-allocation parameter set, and the specific process may be implemented as follows.

The channel parameter acquiring unit of the signal management control system may acquire the channel quality parameters; and the optimization algorithm processing unit may optimize the energy signals and the information signals according to preset optimization objectives and constraints; the preset optimization objectives involve number of carriers of the energy signals, power, and information transfer rate of the information signals; and the constraints involve the power acquired by the receiver being equal to or greater than the minimum power required for the operation mode of the receiver, the sum of powers of the energy signals on the subcarriers being less than or equal to the total power of the energy signals, the average power spectral density on each of subcarrier frequency bands being less than or equal to a given parameter value, and the sum of powers of the information signals on the subcarriers being less than or equal to the total power of the information signals.

In this specific embodiment, the specific optimization process carried out by the optimization algorithm processing unit may comprise the following steps:

Assuming that the total power of baseband signals at the transmitting end is P, and that the total power allocated to the information baseband signal and the total power allocated to the energy baseband signal are PI and PE, respectively, then $P_I+P_E=P$; the set of all the signal carriers is Sc, then $Sc=Sc_E \cup Sc_I$, wherein $Sc_E$ is a set of energy signal subcarriers, and $Sc_I$ is a set of information signal subcarriers; the energy acquired by the receiving end is Q, then $Q=\beta P_E$, wherein $\beta$ is an energy efficiency coefficient; a channel parameter vector is $\underline{h}$, wherein $\underline{h}=[h_1, h_2 \ldots h_N]^T$; and the total number of carriers is N, and the number of carriers allocated to the information signal and the energy signal are $N_I$ and $N_E$, respectively, then $N=N_I+N_E$. Information symbols of the information baseband signal and energy symbols of the energy baseband signal are $S_I(n)$ and $S_E(n)$, respectively, n=1, 2, . . . , m; m≤N; wherein:

$$S_I(n) = \begin{bmatrix} S_{I1} \\ \ldots \\ S_{Im} \end{bmatrix},$$

$$S_E(n) = \begin{bmatrix} S_{E1} \\ \ldots \\ S_{Em} \end{bmatrix}$$

$S_{I1} \sim S_{Im}$ are the $1^{st}$ to $m^{th}$ information symbols of the information baseband signals, respectively, $S_{E1} \sim S_{Em}$ are the $1^{st}$ to $m^{th}$ energy symbols of the energy baseband signals, respectively, and $E[S^2_I(n)]$ and $E[S^2_E(n)]$ represent the energy of the information signal and the energy of the energy signal respectively. Therefore, the power Q acquired by the receiving end may be represented in the following relation:

$$Q = <\underline{h}, E[S^2_E(n)]>,$$

$$i = 1 \ldots N_E,$$

that is, $$Q=h_i*E[S^2_E(1)]+h_2*E[S^2_E(2)]+ \ldots +h_{N_E}*E[S^2_E(h_{N_E})];$$

The power $P_E$ of the energy signal may be represented by the following relation:

$$P_E = \sum_{n=1}^{N_E} E[S^2_E(n)];$$

Allocation and optimization of the power, carriers and spectrum on the information baseband signal and the energy baseband signal may be performed according to the minimum energy required by the receiving end for operation and channel feedback information. The minimum operating power required by the receiving end should be understood as the minimum power required by any of the various operating modes of the receiving end. for example, when the receiving end is in a non-charging mode, the minimum operating power required by the receiving end may be the minimum operating power required by a receiving end circuit; and when the receiving end is in a charging mode, the minimum operating power required by the receiving end may be a sum of the minimum power required by the receiving end circuit for its own operation and the power required for charging.

In this specific embodiment, the optimization algorithm processing unit may include a first optimization processing unit and a second optimization processing unit, said first optimization processing unit may determine a first pre-allocation parameter set for a first baseband signal based on a first optimization parameter set according to a first optimization objective and a first constraint set; and said second optimization processing unit may determine a second pre-allocation parameter set for a second baseband signal based on the first pre-allocation parameter set and a second optimization parameter set according to a second optimization objective and a second constraint set.

In this embodiment, the first baseband signal is the energy baseband signal, and the first optimization objective involves minimizing the number of energy signal carriers $N_E$ and the total power of the energy signal $P_E$ when the conditions in the first constraint set are met.

Said first constraint set involves: 1. the power Q acquired by the receiving end being greater than or equal to the minimum operating power $P_{min}$ required by the receiving end, that is, $Q \geq P_{min}$; 2. the sum of power of energy signal on the subcarriers at the transmitting end being less than or equal to the total power of the energy signal in the baseband signal; and 3. an average power spectral density on each subcarrier band being less than or equal to a given parameter value A, that is, satisfying $E[S^2_E(n)]/B<A$, wherein B is a channel bandwidth on each subcarrier.

Said first optimization parameter set comprises the following parameters: the set of subcarriers in energy signal $Sc_E$, the minimum operating power $P_{min}$ required by the receiving end, the channel bandwidth B on each of subcarriers, the average power spectral density A on each of subcarriers and the channel parameter vector $\underline{h}$.

Said first pre-allocation parameter set comprises the following parameters: the energy signal subcarrier allocation set, the energy signal power allocation set and the total power $P_E$ of the energy signals.

The second baseband signal is the information baseband signal, and the second optimization objective involves maximizing an information transfer rate R when the conditions in the second constraint set are met; and the second constraint set involves the sum of the power of the information signal on the subcarriers being less than or equal to the total power $P_E$ of the information signals.

The second optimization parameter set comprises the following parameters: the information signal subcarrier set, the number of information signal subcarriers $N_I$ and the channel parameter vector $\underline{h}$, wherein $\underline{h}=[h_1, h_2 \ldots h_N]^T$.

Said second pre-allocation parameter set comprises the following parameters: the information signal power allocation set and the information signal subcarrier allocation set.

Based on the above, a system pre-allocation parameter set may be obtained by solving the following optimization problems.

A first pre-allocation parameter set may be derived by the first optimization processing unit according to the following first optimization objective and the first constraint set:
min_$\{\underline{h}, Sc_E, P_{min}, B, A\}$ $P_E$, $N_E$, wherein elements in the $\{\ \}$ represent the first optimization parameters;
s.t. (the following is the first constraint)

$$Q = <\underline{h}, E[S_E^2(n)]>,$$

$$Q \geq P_{min}:$$

$$\sum_{n=1}^{N_E} E[S_E^2(n)] \leq P_E:$$

$$E[S_E^2(n)]/B \leq A,$$

$$n = 1, 2, \ldots, N_E:$$

A second pre-allocation parameter set may be derived by the second optimization processing unit according to the following second optimization objective and the second constraint set.
max_$\{\underline{h}, Sc_E^*, Sc_I\}$ R wherein $Sc_E$ is an optimum energy signal subcarrier allocation set;
s.t. (the following is the second constraint)

$$\sum_{n=1}^{N_I} E[S_I^2(n)] \leq P_I.$$

In order to further explain the operating principle of the optimization process, detailed description will be made below with reference to a specific solving process.

The first optimization processing unit has four solving steps of S1-S4 exemplified as follows:
S1. Initializing $N_E=1$, and the subcarrier set $Sc_E=\Phi$ ($\Phi$ is a null set);
S2. Finding an energy signal subcarrier allocation set $Sc_E=\{Sc_i\}$, i=1, 2, ..., $N_E$, the corresponding energy channel parameter vector is $\underline{h}_E=\{h_i\}$, i=1, 2, ..., $N_E$, and the power acquired by the receiving end may be maximized through the optimization algorithm (for example, a water-filling algorithm) when the conditions in the first constraint set are met. Specifically, the algorithm is as follows:
Sub-step S21:
Find $Sc_8=\{Sc_1\}$, i=1 ... $N_2$;

s.t.

max Q, $$Q \geq P_{min}:$$

$$\sum_{n=1}^{N_E} E[S_E^2(n)] \leq P_E:$$

$$E[S_E^2(n)]/B \leq A,$$

$$n = 1, 2, \ldots, N_E:$$

Sub-step S22: Select the optimum energy signal subcarrier set $Sc_E^*$=argmin $P_E$ from a plurality of sets which are found through S21, wherein argmin $P_E$ represents an parameter condition when the value of $P_E$ is minimized; meanwhile, determine the optimum energy signal power allocation set $\{E^*[S^2{}_E(n)]\}$ and the optimum power acquired by the receiving end $$Q^* = <\underline{h}, \underline{E}^*[S_E^2(n)]>,$$

n=1, 2, ... $N_2$.
S3. If step S2 has no solution, then let $N_E=N_E+1$, and let $Sc_E=\Phi$ to repeat step S2 and S3.
S4. If step S2 has a solution, then $Sc_E^*$, $N_E$ and $P_E$ are determined.

The second optimization processing unit has a solving step of S5 exemplified as follows.
S5. When the optimum energy signal subcarrier set $Sc_E^*$ is determined, the corresponding information signal subcarrier set $Sc_I$ is also determined, $Sc_I=\{Sc_i\}$; the number of information signal subcarriers $N_I=N-N_E$; and the corresponding information channel parameter vector $\underline{h}_I=\{h_i\}$, wherein i=1, 2, ..., $N_I$.

The solving process for optimization of the information transfer rate of the system is as follows:

$$\max\_\{\underline{h}, Sc_E^*, Sc_I\}R$$

s.t.

$$\sum_{n=1}^{N_I} E[S_I^2(n)] \leq P_i.$$

The optimum information signal power allocation set $\{E^*[S^2{}_I(n)]\}$ and the optimum information signal subcarrier set $Sc_I^*$ may be determined through solving, so as to finally obtain the optimum information transfer rate $R^*$=argmax R, wherein n=1, 2, ..., $N_I$.

Wherein, $R^*$=argmax R is specifically expressed as:

$$R^* = B \sum_{n=1}^{N_I} \log_2\left(1 + \frac{E^*[S_I^2(n)]}{N_0 B}\right)$$

Wherein, n=1, 2, ..., $N_I$, and $N_0$ is a noise power density parameter.

Thus, the first pre-allocation parameter set and the second pre-allocation parameter set are obtained through the above-described optimization.

The pre-allocation parameter unit may be configured to generate a pre-allocation parameter set according to the optimization result of the optimization algorithm processing unit, and the pre-allocation parameter set may comprise an information baseband signal pre-allocation parameter set and an energy baseband signal pre-allocation parameter set; the information baseband signal pre-allocation parameter set may comprise an information signal power allocation set and an information signal subcarrier allocation set; and the energy baseband signal pre-allocation parameter set may comprise an energy signal subcarrier allocation set, an energy signal power allocation set and the total power of energy signals.

In this embodiment, the baseband signal generating unit may comprise an information baseband signal generating unit and an energy baseband signal generating unit. The energy baseband signal generating unit may perform power allocation on energy baseband signal data streams according to the energy signal power allocation set and the total power of the energy signals in the energy baseband signal pre-allocation parameter set, and add subcarrier allocation information to frame headers of corresponding energy baseband signal data streams according to the energy signal subcarrier allocation set. The information baseband signal generating unit my be configured to generate information baseband signals according to specific transfer demands, perform power allocation on the information baseband signal data streams according to the information signal power allocation set, and add subcarrier allocation information to frame headers of corresponding information baseband signal data streams according to the information signal subcarrier allocation set. Information baseband signals generated by the baseband signal generating unit is high-rate serial information stream, and the energy baseband signal generated is high-power serial energy stream.

In this embodiment, the encoding unit may comprise an information baseband signal encoding unit and an energy baseband signal encoding unit; the information baseband signal encoding unit may perform convolutional encoding on the information baseband signal; and the energy baseband signal encoding unit may perform quadrature encoding on the energy baseband signal. In order to protect the baseband signals and improve bit error performance of the system, two paths of baseband signal need to be effectively encoded separately, wherein the information signals contains more useful data which need to be encoded in some encoding manners with high reliability, while the energy signal only needs to be identified and transmitted, so that the encoding manner for the energy signal can be relatively simple.

After being encoded by the encoding unit, the information baseband signal and energy baseband signal are transmitted into the serial-parallel conversion unit for serial-parallel conversion so as to output parallel data streams. In order to perform multi-carrier broadband modulation, high-rate serial information stream must be converted into low-rate parallel information streams, and high-power serial energy stream must be converted into low-power parallel energy streams.

In this specific embodiment, the mapping unit may perform corresponding carrier modulation pre-allocation on the information baseband signal and the energy baseband signal in the parallel data streams based on power allocation information and subcarrier allocation information in the frame headers of the energy baseband signal and the information baseband signal in the data streams according to the pre-allocation parameter set.

In this embodiment, the modulation unit may comprise an information baseband signal modulation unit and an energy baseband signal modulation unit. Information signal streams are modulated to a signal form suitable for pass band transmission through information modulation carried out by the information baseband signal modulation unit according to the result of carrier modulation pre-allocation, and are shifted to a preset band. As the average power spectral density (PSD) of the energy baseband signals may exceed the safety standard, in this embodiment, the energy baseband signal modulation unit first performs spectrum spreading modulation on the energy baseband signals to decrease the average power spectral density, and then modulates the energy baseband signals using preset subcarriers. In this embodiment, the energy baseband signal modulation unit comprises an impulse forming filtering module, a spreading module and a mixing module three of which are connected sequentially. The energy baseband signals are first subjected to impulse forming processing in the impulse forming filtering module, then are spread by the spreading module using spreading codes, and then are transmitted into the mixing module for up-conversion processing using preset subcarriers. The modulated information signals and energy signals are converted into a serial data stream through parallel-serial conversion by the parallel-serial conversion unit, and are transmitted into the antenna unit for transmittance.

In this embodiment, a guard interval inserting unit may be arranged between the modulation unit and the parallel-serial conversion unit, thus inter-symbol interference may be prevented by the guard interval inserting unit by adding guard prefixes in the information baseband signal and the energy baseband signal.

In this embodiment, preferably, the energy baseband signal may be provided as the first baseband signal, and the information baseband signal may be provided as the second baseband signal. Optimizing the information baseband signal on the basis of optimization of the energy baseband signals ensures that the power acquired by the receiver reaches the minimum power required by a corresponding operating mode and guarantees that the receiver operates normally, thus the stability and reliability of the system is greatly improved. Through optimization of the information baseband signals, the power is further reasonably allocated, the communication rate is further raised, and performance of the system is further improved.

Figure 3:
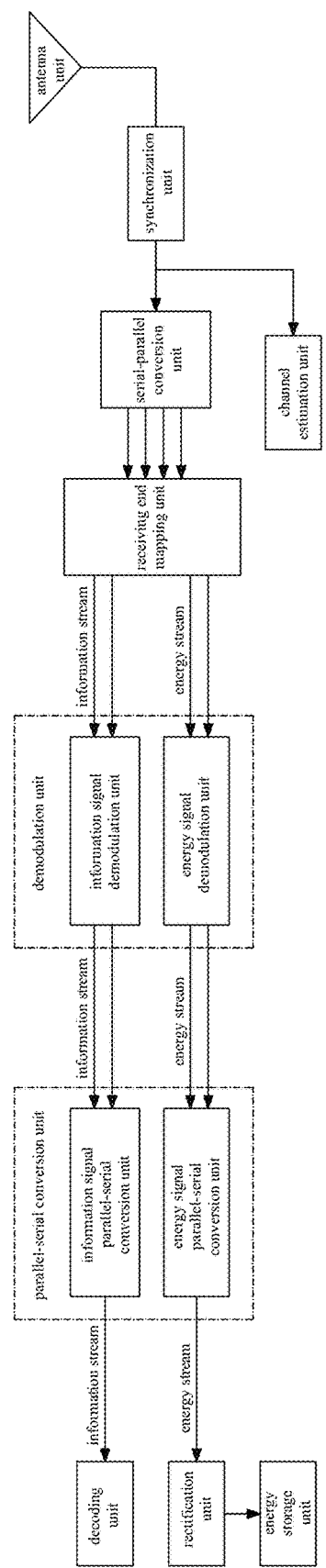
FIG. 3 is a structural schematic view of a receiving system for multi-carrier broadband simultaneous information and energy transfer.

FIG. 3 is a structural schematic view of a receiving system for multi-carrier broadband simultaneous information and energy transfer. As shown in FIG. 3, the present system also discloses a receiving system for multi-carrier broadband simultaneous information and energy transfer, which comprises:

an antenna unit, configured to receive a serial signal transmitted from a transmitting end;

a synchronization unit, configured to synchronize the received serial signal with the transmitting end in frequency and phase;

a channel estimation unit, configured to generate channel quality parameters and feed the channel quality parameters back to the transmitting system for multi-carrier broadband simultaneous information and energy transfer;

a serial-parallel conversion unit, configured to convert the received serial signal into parallel signals;

a receiving end mapping unit, configured to separate the information signal from the energy signal in the parallel signals;

a demodulation unit, configured to demodulate the information signal and the energy signal respectively to obtain information baseband signal and energy baseband signal;

a parallel-serial conversion unit, configured to convert the parallel information baseband signal and energy baseband signal into a serial signal;

a decoding unit, configured to decode the information baseband signal in the serial signal; and a rectification unit, configured to filter and rectify the energy baseband signal in the serial signal and converting it into DC signal to be stored in storage batteries.

In this embodiment, the modulation unit may comprise an information signal modulation unit and an energy signal modulation unit. The parallel-serial conversion unit may comprise an information signal parallel-serial conversion unit and an energy signal parallel-serial conversion unit.

The present invention has been described with reference to preferred embodiments which are not intended to limit the invention, and any modification, equivalent, improvement and the like made within the spirit and principle of the invention should all fall within the protection scope thereof.

What is claimed is:

1. A transmitting system for multi-carrier broadband simultaneous information and energy transfer, comprising:
   a signal management control system, configured to match with an optimization algorithm, perform pre-allocation of carrier, power and frequency spectrum on information signal data stream and energy signal data stream in a baseband signal dynamically based on channel quality parameters, so as to generate a pre-allocation parameter set;
   a baseband signal generating unit, configured to generate information baseband signal and energy baseband signal corresponding to the pre-allocation parameter set;
   an encoding unit, configured to encode the information baseband signal and the energy baseband signal respectively so as to generate corresponding encoded information baseband signal and encoded energy baseband signal;
   a serial-parallel conversion unit, configured to perform serial-parallel conversion on the encoded information baseband signal and the encoded energy baseband signal to generate parallel data streams;
   a mapping unit, configured to classify the parallel data streams and perform corresponding modulation and pre-allocation on the information baseband signal and energy baseband signal in the parallel data streams according to the pre-allocation parameter set;
   a modulation unit, configured to modulate the information baseband signal and energy baseband signal in the parallel data streams onto pre-allocated subcarriers according to the result of the modulation and pre-allocation;
   a parallel-serial conversion unit, configured to convert the parallel data streams into a serial data stream and transmit it to an antenna unit; and
   an antenna unit, configured to transmit the serial data stream output from the parallel-serial conversion unit.

2. The transmitting system for multi-carrier broadband simultaneous information and energy transfer of claim 1, wherein the signal management control system comprises:
   a channel parameter acquiring unit, configured to acquire channel quality parameters;
   an optimization algorithm processing unit, configured to optimize energy signal and information signal based on preset optimization objectives and constraints; wherein the preset optimization objectives involve number of energy baseband signal carriers, power, and information transfer rate of information baseband signal; and the constraints involve:
   the power acquired by the receiver being greater than or equal to a minimum power required by the operation of the receiver per unit time;
   the sum of powers of energy signals on the subcarriers being less than or equal to a total power of the energy signals;
   an average power spectral density on each of subcarrier bands being less than or equal to a given parameter value; and
   a sum of powers of information signals on the subcarriers being less than or equal to a total power of the information signals; and
   a pre-allocation parameter unit, configured to generate a pre-allocation parameter set according to an optimization result of the optimization algorithm processing unit.

3. The transmitting system for multi-carrier broadband simultaneous information and energy transfer of claim 2, wherein the pre-allocation parameter set comprises an information baseband signal pre-allocation parameter set and an energy baseband signal pre-allocation parameter set;
   wherein the information baseband signal pre-allocation parameter set comprises:
      an information signal power allocation set; and
      an information signal subcarrier allocation set; and
   wherein the energy baseband signal pre-allocation parameter set comprises:
      an energy signal subcarrier allocation set;
      an energy signal power allocation set; and
      the total power of energy signals.

4. The transmitting system for multi-carrier broadband simultaneous information and energy transfer of claim 3, wherein the baseband signal generating unit comprises an information baseband signal generating unit and an energy baseband signal generating unit; and
   the energy baseband signal generating unit performs power allocation on energy baseband signal data streams according to the energy signal power allocation set and the total power of the energy signals in the energy baseband signal pre-allocation parameter set, and adds subcarrier allocation information into frame headers of corresponding energy baseband signal data streams according to the energy signal subcarrier allocation set.

5. The transmitting system for multi-carrier broadband simultaneous information and energy transfer of claim 2, wherein the encoding unit comprises an information baseband signal encoding unit and an energy baseband signal encoding unit;
   wherein the information baseband signal encoding unit performs convolutional encoding on the information baseband signal; and the energy baseband signal encoding unit performs quadrature encoding on the energy baseband signal.

6. The transmitting system for multi-carrier broadband simultaneous information and energy transfer of claim 2, wherein the modulation unit comprises an information baseband signal modulation unit and an energy baseband signal modulation unit;
   wherein the energy baseband signal modulation unit performs spectrum spreading modulation on the energy baseband signal.

7. The transmitting system for multi-carrier broadband simultaneous information and energy transfer of claim 6, wherein the energy baseband signal modulation unit comprises an impulse forming filtering module, a spreading module and a mixing module three of which are connected sequentially.

8. The transmitting system for multi-carrier broadband simultaneous information and energy transfer of claim 2, wherein a guard interval inserting unit is arranged between the modulation unit and the parallel-serial conversion unit.

* * * * *